United States Patent
Lui

(10) Patent No.: US 10,714,580 B2
(45) Date of Patent: Jul. 14, 2020

(54) SOURCE BALLASTING FOR P-CHANNEL TRENCH MOSFET

(71) Applicant: Alpha and Omega Semiconductor (Cayman) Ltd., Grand Cayman (KY)

(72) Inventor: Sik Lui, Sunnyvale, CA (US)

(73) Assignee: Alpha and Omega Semiconductor (Cayman) Ltd., Grand Cayman (KY)

( * ) Notice: Subject to any disclaimer, the term of this patent is extended or adjusted under 35 U.S.C. 154(b) by 0 days.

(21) Appl. No.: 15/891,300

(22) Filed: Feb. 7, 2018

(65) Prior Publication Data

US 2019/0245051 A1 Aug. 8, 2019

(51) Int. Cl.
| | |
|---|---|
| H01L 29/423 | (2006.01) |
| H01L 29/78 | (2006.01) |
| H01L 29/66 | (2006.01) |
| H01L 27/06 | (2006.01) |
| H01L 21/265 | (2006.01) |
| H01L 27/07 | (2006.01) |

(52) U.S. Cl.
CPC ........ *H01L 29/4236* (2013.01); *H01L 21/265* (2013.01); *H01L 27/0629* (2013.01); *H01L 27/0727* (2013.01); *H01L 29/66492* (2013.01); *H01L 29/66666* (2013.01); *H01L 29/7827* (2013.01); *H01L 29/7833* (2013.01)

(58) Field of Classification Search
CPC ........... H01L 29/4236; H01L 21/26513; H01L 21/28035; H01L 21/3081; H01L 21/31144; H01L 21/76877; H01L 21/76897; H01L 29/0847; H01L 29/1095; H01L 29/41766; H01L 29/4916; H01L 29/66613; H01L 29/78

See application file for complete search history.

(56) References Cited

U.S. PATENT DOCUMENTS

| | | | |
|---|---|---|---|
| 5,998,833 | A | 12/1999 | Baliga |
| 6,479,352 | B2 | 11/2002 | Blanchard |
| 6,927,458 | B2 | 8/2005 | Worley |
| 7,816,720 | B1 | 10/2010 | Hsieh |
| 8,138,605 | B2 | 3/2012 | Chang et al. |
| 8,324,683 | B2 | 12/2012 | Lui et al. |
| 8,394,702 | B2 | 3/2013 | Tai et al. |
| 8,502,302 | B2 | 8/2013 | Su et al. |
| 8,507,978 | B2 | 8/2013 | Bhalla et al. |

(Continued)

FOREIGN PATENT DOCUMENTS

| | | | |
|---|---|---|---|
| JP | 2003-101019 | * | 4/2003 |
| WO | 2015114803 A1 | | 8/2015 |

*Primary Examiner* — Ahmed N Sefer
(74) *Attorney, Agent, or Firm* — JDI Patent; Joshua D. Isenberg; Robert Pullman

(57) ABSTRACT

A trench metal-oxide-semiconductor field-effect transistor (MOSFET) device, comprising a substrate of a first conductivity type, a body region of a second conductivity type, a gate electrode formed in a gate trench extending in the body region and substrate, a lightly doped source region and a heavily doped source region formed in the body region, and a trench contact extending to the body region formed in a contact trench. A contact implant of the second conductivity type is formed surrounding a bottom portion of the contact trench and it also forms surrounding sidewall portions of the contact trench where it contacts with the lightly doped source region to form a PN diode.

21 Claims, 15 Drawing Sheets

(56) References Cited

U.S. PATENT DOCUMENTS

| | | |
|---|---|---|
| 8,580,676 B2 | 11/2013 | Chang et al. |
| 8,703,563 B2 | 4/2014 | Hébert et al. |
| 8,748,268 B1 | 6/2014 | Pan et al. |
| 8,753,935 B1* | 6/2014 | Bobde ............... H01L 29/66719 438/270 |
| 8,785,270 B2 | 7/2014 | Su et al. |
| 8,809,948 B1 | 8/2014 | Yilmaz et al. |
| 8,828,857 B2 | 9/2014 | Lui et al. |
| 8,907,416 B2 | 12/2014 | Tai et al. |
| 8,933,506 B2 | 1/2015 | Bobde et al. |
| 8,946,816 B2 | 2/2015 | Bobde et al. |
| 8,951,867 B2 | 2/2015 | Lee et al. |
| 8,969,950 B2 | 3/2015 | Pan |
| 8,980,716 B2 | 3/2015 | Lui et al. |
| 9,006,053 B2 | 4/2015 | Pan et al. |
| 9,082,790 B2 | 7/2015 | Bobde et al. |
| 9,105,494 B2 | 8/2015 | Lee et al. |
| 9,136,380 B2 | 9/2015 | Yilmaz et al. |
| 9,190,512 B2 | 11/2015 | Lee et al. |
| 9,214,545 B2 | 12/2015 | Tai et al. |
| 9,230,957 B2 | 1/2016 | Lui et al. |
| 9,252,264 B2 | 2/2016 | Bobde et al. |
| 9,391,061 B2 | 7/2016 | Guan et al. |
| 9,412,733 B2 | 8/2016 | Calafut et al. |
| 9,450,088 B2 | 9/2016 | Lee et al. |
| 9,484,452 B2 | 11/2016 | Bobde et al. |
| 9,484,453 B2 | 11/2016 | Yilmaz et al. |
| 9,502,554 B2 | 11/2016 | Bobde et al. |
| 9,530,885 B2 | 12/2016 | Bobde et al. |
| 9,564,516 B2 | 2/2017 | Pan |
| 9,685,435 B2 | 6/2017 | Lui et al. |
| 9,685,523 B2 | 6/2017 | Bobde et al. |
| 9,711,637 B2 | 7/2017 | Numabe et al. |
| 2009/0272982 A1* | 11/2009 | Nakamura ......... H01L 29/66848 257/77 |
| 2011/0233667 A1 | 9/2011 | Tai et al. |
| 2012/0025874 A1 | 2/2012 | Saikaku et al. |
| 2012/0037983 A1* | 2/2012 | Hshieh ............... H01L 27/0629 257/334 |
| 2012/0068262 A1* | 3/2012 | Pan .................... H01L 29/66734 257/332 |
| 2012/0083084 A1* | 4/2012 | Hu ................. H01L 21/823418 438/270 |
| 2012/0129328 A1* | 5/2012 | Chang .................... H01L 29/47 438/582 |
| 2012/0132988 A1 | 5/2012 | Lui et al. |
| 2012/0193676 A1 | 8/2012 | Bobde et al. |
| 2012/0319132 A1* | 12/2012 | Bhalla .................. H01L 29/407 257/77 |
| 2013/0069146 A1* | 3/2013 | Okumura ............ H01L 21/2257 257/330 |
| 2014/0048846 A1* | 2/2014 | Lui ..................... H01L 29/0834 257/139 |
| 2014/0070309 A1* | 3/2014 | Sakai ..................... H01L 27/07 257/334 |
| 2014/0231963 A1 | 8/2014 | Guan et al. |
| 2014/0235024 A1 | 8/2014 | Pan et al. |
| 2014/0242771 A1 | 8/2014 | Sharma et al. |
| 2015/0021682 A1 | 1/2015 | Bobde et al. |
| 2015/0097232 A1 | 4/2015 | Tai et al. |
| 2015/0137227 A1 | 5/2015 | Bobde et al. |
| 2015/0171192 A1* | 6/2015 | Pan .................... H01L 29/66734 438/237 |
| 2015/0171201 A1 | 6/2015 | Lui et al. |
| 2015/0279989 A1 | 10/2015 | Bobde et al. |
| 2015/0372090 A1* | 12/2015 | Oosawa .................. H01L 29/78 257/331 |
| 2016/0141411 A1 | 5/2016 | Bobde et al. |
| 2016/0300833 A1 | 10/2016 | Guan et al. |
| 2017/0263727 A1* | 9/2017 | Mallikarjunaswamy ................ H01L 29/735 |
| 2017/0288028 A1* | 10/2017 | Xue .................... H01L 29/407 |
| 2017/0373185 A1* | 12/2017 | Yilmaz ............... H01L 29/4236 |
| 2018/0097078 A1* | 4/2018 | Lui .................. H01L 21/26513 |

* cited by examiner

100A

100B

US 10,714,580 B2

SOURCE BALLASTING FOR P-CHANNEL TRENCH MOSFET

FIELD OF THE DISCLOSURE

This disclosure relates in general to metal-oxide-semiconductor field-effect transistors (MOSFETs), and more specifically to an improved trench MOSFET configuration with a source ballast resistor and a method for fabricating the same.

BACKGROUND OF INVENTION

Integrated circuits, such as microprocessors and memory devices, include many metal-oxide-semiconductor field-effect transistors (MOSFETs), which provide the basic switching functions to implement logic gates, data storage, power switching, and the like. When MOSFETs are connected in parallel as shown in FIG. 1A to handle large current in slow switching applications, parameter mismatch (e.g., on resistance, threshold voltage, channel lengths) between MOSFETs results in dynamic current imbalance, and thus causing current hogging. Current hogging takes places when a larger fraction of a current passes through one of several parallel MOSFETs due to lower threshold voltage or channel length. Since that particular MOSFET dissipates most of the device power, localized hot spots appear. The higher temperature further lowers threshold voltage of that MOSFET and draws more power. Ultimately, thermal runaway would occur.

It is known in the field that source ballasting may provide negative feedback to counter current hogging. Thus, in order to avoid current hogging, a source ballast resistor is typically added in series with each MOSFET as shown in FIG. 1B to equalize the distribution of the load current among the parallel MOSFETs. It is within this context that embodiments of the present invention arise.

BRIEF DESCRIPTION OF THE DRAWINGS

Objects and advantages of aspects of the present disclosure will become apparent upon reading the following detailed description and upon reference to the accompanying drawings in which:

FIGS. 7E' and 7F' are three-dimensional views corresponding to the cross-sectional schematic diagrams of FIGS. 7E and 7F.

DESCRIPTION OF THE SPECIFIC EMBODIMENTS

In the following Detailed Description, reference is made to the accompanying drawings, which form a part hereof, and in which is shown by way of illustration specific embodiments in which the invention may be practiced. For convenience, use of + or − after a designation of conductivity or net impurity carrier type (p or n) refers generally to a relative degree of concentration of designated type of net impurity carriers within a semiconductor material. In general terms an n+ material has a higher n type net dopant (e.g., electron) concentration than an n material and an n material has a higher carrier concentration than an n− material. Similarly, a p+ material has a higher p type net dopant (e.g., hole) concentration than a p material and a p material has a higher concentration than a p− material. It is noted that what is relevant is the net concentration of the carriers, not necessarily dopants. For example, a material may be heavily doped with n-type dopants but still have a relatively low net carrier concentration if the material is also sufficiently counter-doped with p-type dopants. As used herein, a concentration of dopants less than about $10^{16}/cm^3$ may be regarded as "lightly doped" and a concentration of dopants greater than about $10^{17}/cm^3$ may be regarded as "heavily doped".

In the following Detailed Description, the depth direction of the gate trenches is referred to as the y direction, thus the plane of the depth direction of the gate trenches is the x-y plane; and the channel width direction of the device is referred to as the z direction, thus the plane of the channel width direction is the y-z plane.

INTRODUCTION

Some designs have been proposed for having a ballast resistor connected in series with a MOSFET. U.S. Pat. No. 6,927,458 to Worley, the disclosure of which is hereby incorporated herein as reference, discloses applying ballast structures to both the source and drain regions in a CMOS design. U.S. Pat. No. 7,816,720 to Hsieh and U.S. Pat. No. 8,703,563 to Hebert et al., the disclosure of which are hereby incorporated herein as reference, both mention using source ballast resistors to control gain of the circuit to give more uniformity when the trench MOSETs are connected in parallel. Since these designs have the source ballast resistor laterally connected in series with the heavily doped source region in a MOSFET, the source ballast resistors in these designs would take up a large area. In addition, it requires a new layout/design whenever a change of resistance is needed.

Figure 1A:
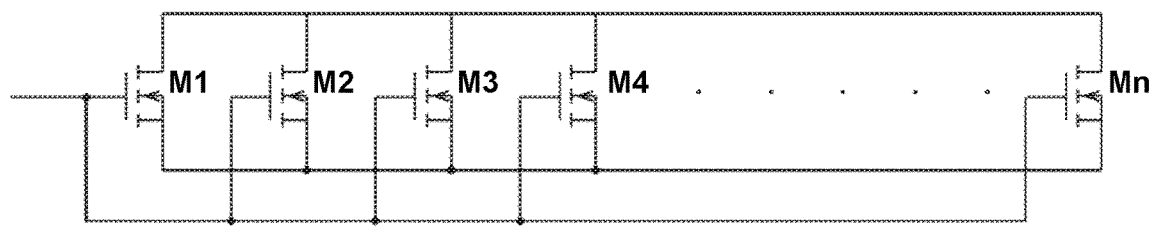
FIG. 1A is a schematic diagram of MOSFETs connected in parallel.
Figure 1B:
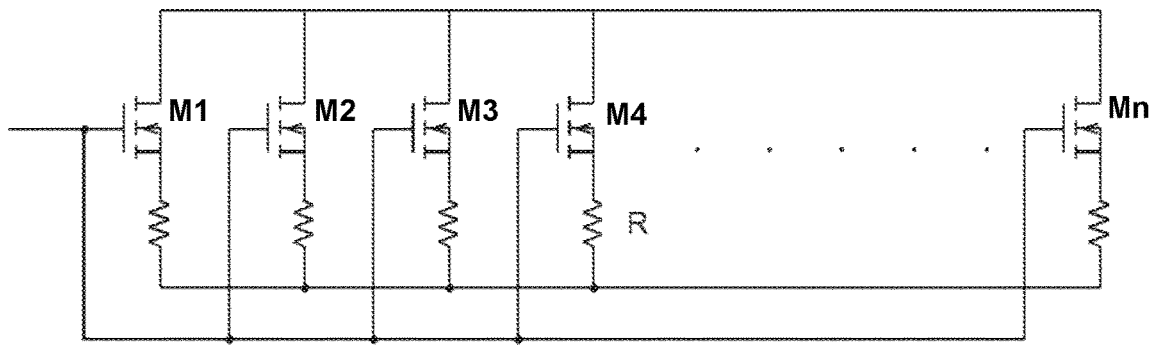
FIG. 1B is a schematic diagram of parallel MOSFETs having a source ballasting resistor connected in series with each MOSFET.
Figure 2:
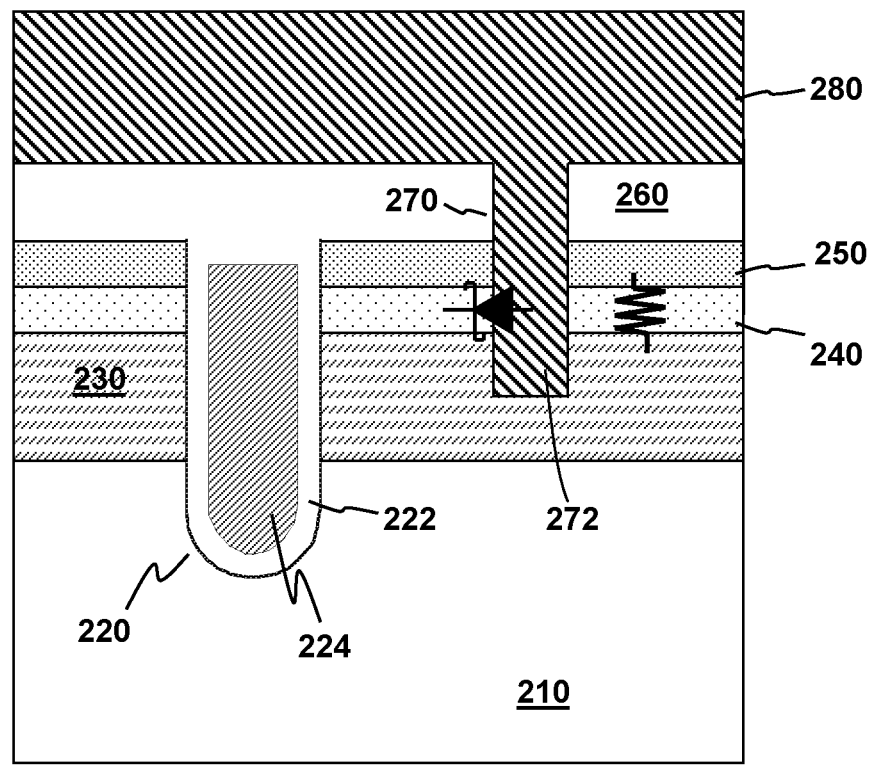
FIG. 2 is a cross-sectional schematic diagram of portions of an n-channel trench MOSFET device with source ballasting.

An improved configuration of a trench MOSFET device with a contact source ballast structure is discussed in U.S. patent applicant Ser. No. 15/498,289 filed Apr. 26, 2017 to Lui et al., the entire disclosures of which are hereby incorporated herein as reference. FIG. 2A of U.S. patent applicant Ser. No. 15/498,289 is reproduced herein as FIG. 2. Specifically, the trench MOSFET device 200 comprises a lightly doped source region 240 forming the ballast structure between the heavily doped source region 250 and the body region 230. The ballast resistance can be adjusted easily in a trench MOSFET 200 by changing the depth of the heavily doped source region and by changing the doping concentration of the lightly doped source region. The resistor width can also be adjusted by changing the contact width, e.g., the width of the contact trench as viewed from above. When the trench MOSFET device 200 is an n-channel device, a Schottky diode is formed at the contact between the lightly doped source region 240 and the source contact 272. Since a Schottky contact is formed between the lightly doped source region and the source body short, channel electron current passes through the lightly doped source region to the heavily doped source region parallel to the direction of the trench before flowing to the source contact 272.

Figure 3:
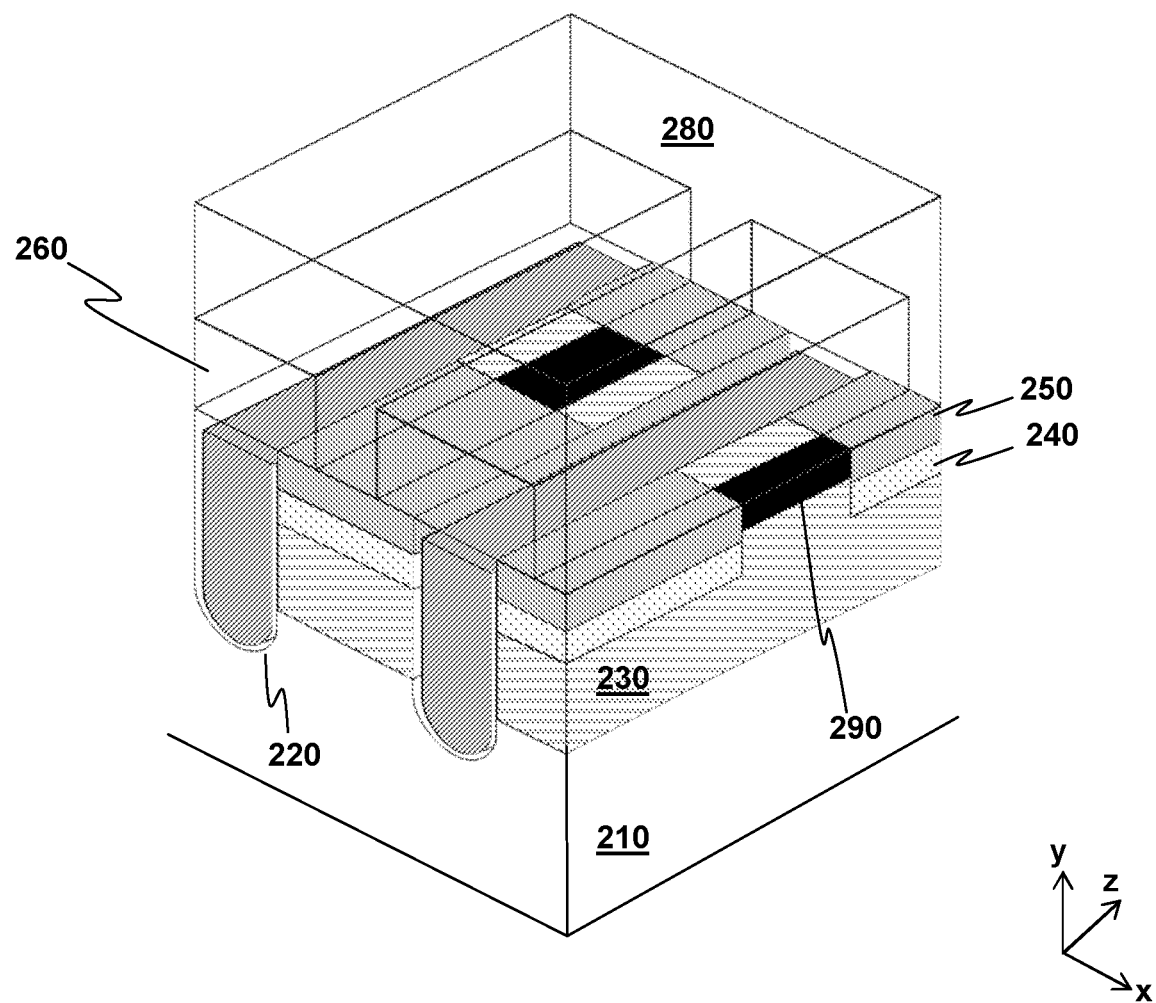
FIG. 3 is a three-dimensional view of a source-ballasted trench MOSFET device with a surface body contact in the z-direction.

However, when the trench MOSFET device 200 is a p-channel device, no Schottky diode is formed at the contact between the lightly doped source region 240 and the source body short contact 272. Instead, the lightly doped source region 240 forms an ohmic contact to the source contact 272. As such, channel hole current flows laterally to the source contact 272 in the lightly doped source region 240, making the ballasting effect inconsistent. Such a problem may be solved by forming a surface body contact 290 in the z direction (i.e., the channel width direction of the device) as shown in FIG. 3. However, this would reduce the channel width of the device and thus affect the size of the device.

Aspects of the present disclosure disclose an improved configuration of a trench MOSFET device with a source ballast structure. Specifically, the trench MOSFET device according to aspects of present disclosure comprises a lightly doped source region of a first conductivity type that forms the ballast structure between a heavily doped source region of the first conductivity type and the body region of a second conductivity type. The device also comprises a sidewall trench contact to the body region and a PN diode formed on the sidewall of trench contact where it contacts with the lightly doped source region.

In one aspect of the present disclosure, the trench MOSFET device has the sidewall trench contact to the body region as well as the heavily doped source region in the x-y plane. In another aspect of the present disclosure, the trench MOSFET device has a surface contact to the heavily doped source region in the x-y plane and the sidewall trench contact to the body region in the z direction (i.e., the y-z plane) that is orthogonal to the depth direction of the gate trenches. Unlike the source-ballasted devices shown in FIG. 3, devices in accordance with aspects of the present disclosure have minimal loss of channel width and thus causing minimum effects on size of the device.

In the following examples, the MOSFET device is described as a p-channel trench MOSFET device in which the source region and drain region for the device cells have p type conductivity and the body region has n type conductivity. It is noted that these conductivity types may be reversed in order to obtain an n-channel trench MOSFET.

Embodiment 1

Figure 4:
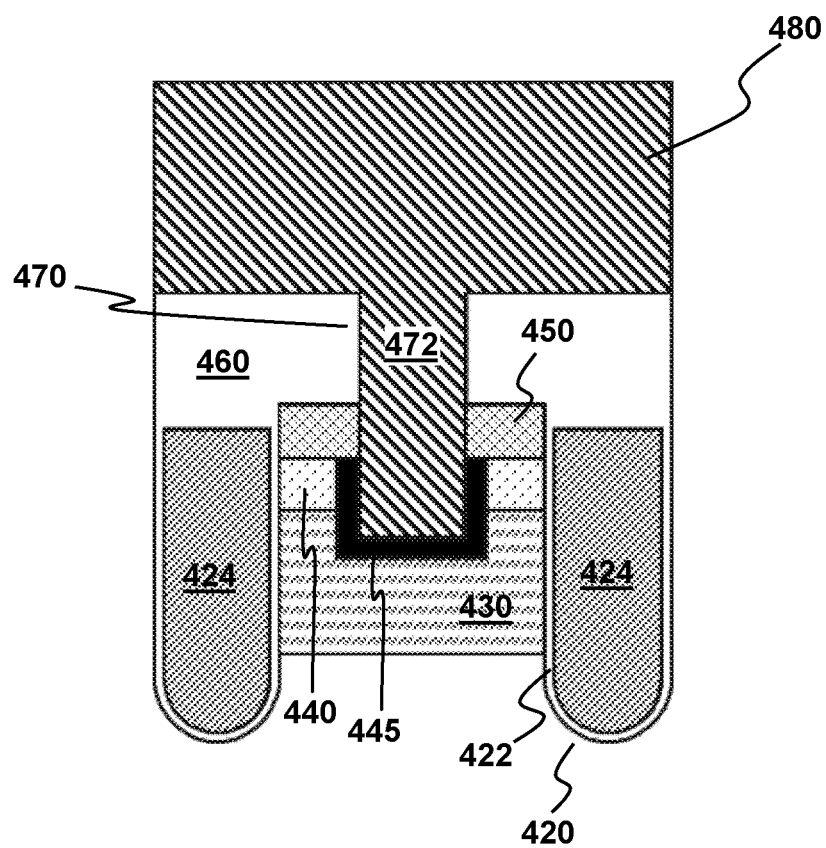
FIG. 4 is a cross-sectional schematic diagram of portions of a trench MOSFET device according to aspects of the present disclosure.

FIG. 4 illustrates a cross-sectional schematic diagram of portions of a trench MOSFET device according to aspects of the present disclosure. As with all the other figures described herein, the relative dimensions and sizes of the elements shown do not reflect actual dimensions and are for illustrative purposes only.

The trench MOSFET device 400 starts with a substrate 410. The substrate 410 may include an epitaxial layer of a first conductivity type on top of a heavily doped silicon wafer of the same conductivity type. By way of example, and not by way of limitation, the epitaxial layer and the silicon wafer may be doped with any suitable p-type dopant species (ions or atoms), such as boron. The silicon wafer may be heavily doped compared to the doping for the epitaxial layer. The substrate 410 acts as the drain of the trench MOSFET device 400.

A body region 430 of a second conductivity type is formed above the substrate 410. The second conductivity type is opposite to the first conductivity type. For a p-channel device, the first conductivity type is p-type and the second conductivity type is n-type. The body region 430 may be doped with any suitable n-type dopant species, such as phosphorous or arsenic.

A gate trench 420 is formed in the body region 430 and extended to the top portions of the substrate 410. The gate trench is lined with a dielectric material 422 such as silicon oxide. A gate electrode 424 is formed in the gate trench 420 and insulated from the body region 430 and substrate 410 by the dielectric material 422 lining the gate trench 420. By way of example, and not by way of limitation, the gate electrode 424 may be composed of polysilicon or any other conductive material.

A lightly doped source region 440 is formed in the top portions of the body region 430 as shown in FIG. 4. The source region 440 may be lightly doped with dopants of the same conductivity type as the substrate 410. By way of example, and not by way of limitation, the doping concentration of the lightly doped source region 440 may range from about $5 \times 10^{15}/cm^3$ to about $1 \times 10^{18}/cm^3$.

A heavily doped source region 450 is formed above the lightly doped source region 440. The source region 450 may be heavily doped with dopants of the same conductivity type as the substrate 410. By way of example, and not by way of limitation, these source regions 450 may be doped with p+ type for a p type substrate 410. By way of example, and not by way of limitation, the doping concentration of the heavily doped source region 450 may range from about $8 \times 10^{19}/cm^3$ to about $1 \times 10^{20}/cm^3$. In the implementation depicted in FIG. 4, the heavily doped source regions 450 span the width of the region between the gate trench 420 and the contact trench 470.

A dielectric layer 460 is formed on top of the heavily doped source region 450. A contact trench 470 having a source contact 472 formed therein is provided between two adjacent gate trenches 420. A source metal pad 480 is provided above the dielectric layer 460 and the source contact 472. The source contact 472 connects the source metal pad 480 to the body region 430. The source metal pad 480 and the source contact 472 serve as the source pad and provide an external connection to the source region 450 of the trench MOSFET device 400.

A heavily doped contact implant 445 of the second conductivity type is formed at the bottom of the contact trench 470 and its sidewall where it contacts with the lightly doped source region 440. By way of example, and not by way of limitation, the heavily doped contact implant may be formed by counter doping the lightly doped source region 440. The contact implant 445 may be doped with any suitable n-type dopant species, such as phosphorous or arsenic. By way of example, and not by way of limitation, the doping concentration of heavily doped contact implant 445 may range from about $5 \times 10^{18}/cm^3$ to about $5 \times 10^{19}/cm^3$, which is not enough to counter dope the heavily doped source region 450. As such, a PN diode is formed on the sidewall of the contact trench 470 where it contacts with the lightly doped source region 440. With the PN diode formed at the interface between the lightly doped source region 440 and the contact implant 445, the channel hole current is prevented from flowing laterally to the source contact 472 in the lightly doped source region 440. In other words, channel hole current passes through the lightly doped source region 440 to the heavily doped source region 450 parallel to the direction of the trench before flowing to the source contact 472.

As shown in FIG. 4, the trench MOSFET device 400 has a sidewall trench contact to the body region 430 as well as a sidewall trench contact to the heavily doped source region 450 in the x-y plane. According to the configuration described above, a ballast structure is formed at the lightly doped source region 440 between the heavily doped source region 450 and the body region 430. In addition, a PN diode is formed at the contact between the lightly doped source region 440 and the source contact 472 and an ohmic contact is formed at the contact between the heavily doped source region 450 and the source contact 472. With the PN diode formed at the interface between the lightly doped source region 440 and the contact implant 445, the channel hole current is prevented from flowing laterally to the source contact 472 in the lightly doped source region 440. In other words, channel hole current passes through the lightly doped source region 440 to the heavily doped source region 450 parallel to the direction of the trench before flowing to the source contact 472. The ballast resistance can be adjusted easily in a trench MOSFET according to aspects of the present disclosure. Specifically, the resistor length can be adjusted by changing the depth of the heavily doped source region. The resistor width can be adjusted by changing the contact width. Additionally, the resistivity can be adjusted by changing the doping concentration of the lightly-doped source region.

When the device has a smaller pitch, the space between the adjacent gate trench 420 and contact trench 470 is limited. With the contact implant 445, the space between the channel and the contact implant may become too narrow and thus affecting the threshold voltage of the device. Another aspect of the present disclosure as shown in FIGS. 5A and 5B provides a trench MOSFET device has a surface contact to the heavily doped source region in the x-y plane and the sidewall trench contact to the body region in the z direction (i.e., the y-z plane indicated by cut line A-A' in FIG. 5A) that is orthogonal to the depth direction of the gate trenches.

Embodiment 2

Figure 5A:
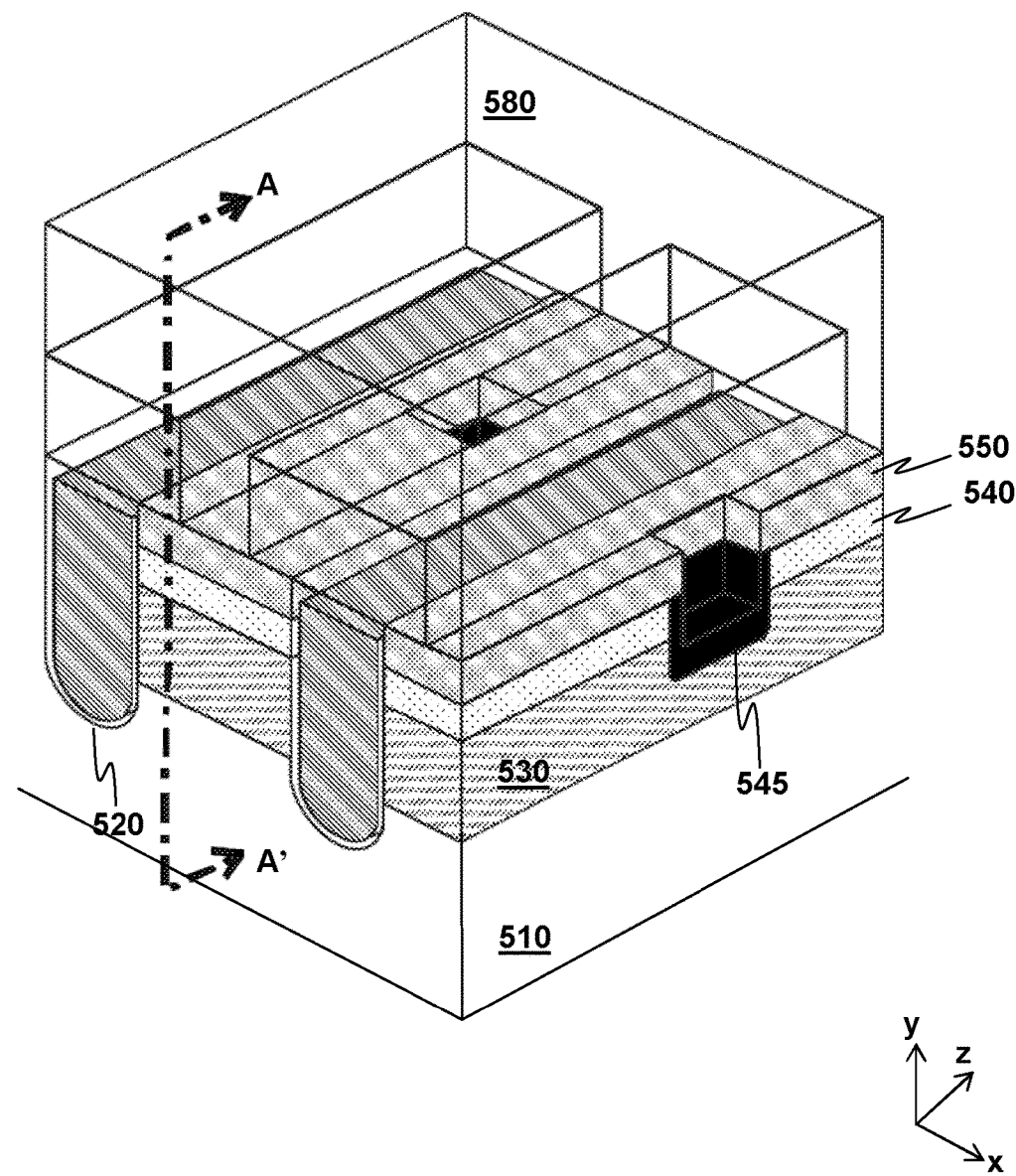
FIG. 5A is a three-dimensional view of a trench MOSFET device according to aspects of the present disclosure.
Figure 5B:
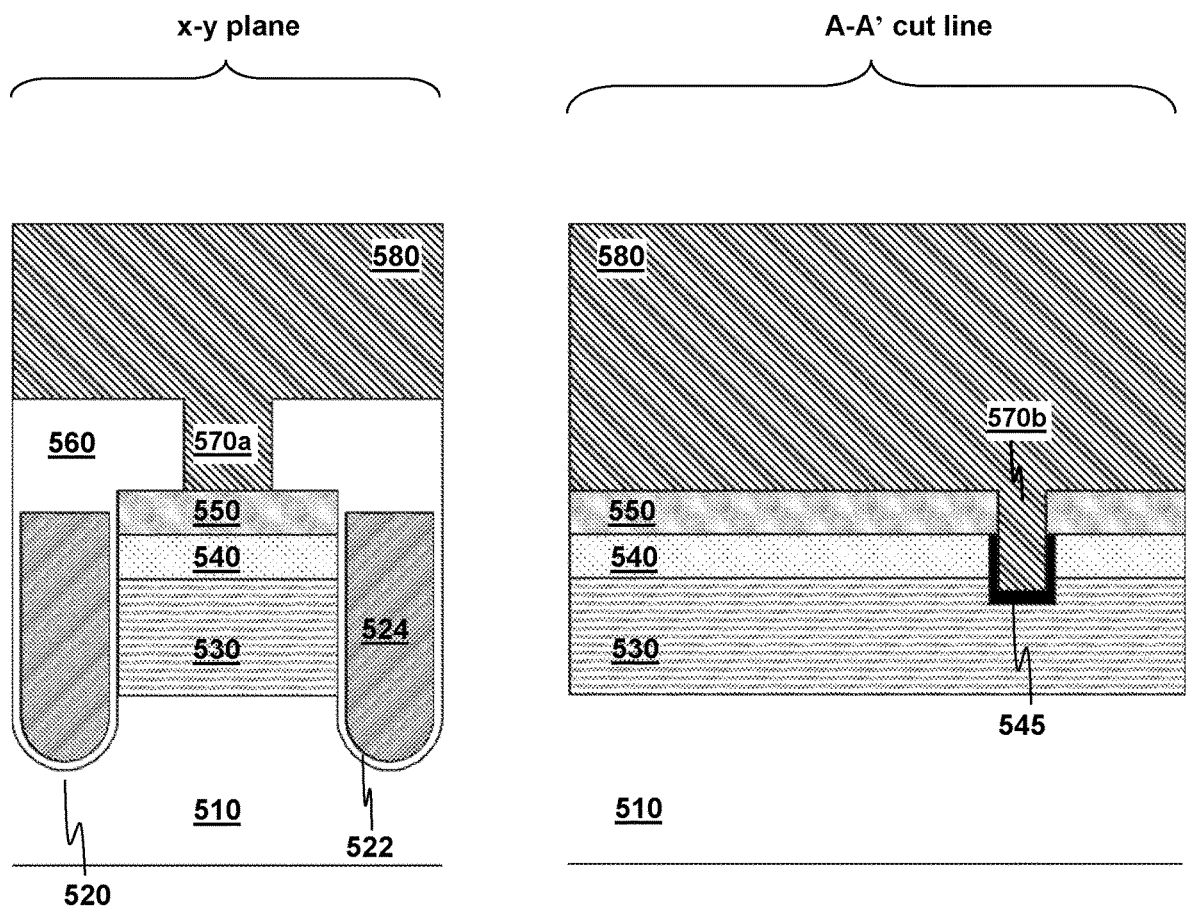
FIG. 5B is a cross-sectional schematic diagram of portions of a trench MOSFET device of FIG. 5A.

FIG. 5A illustrates a three-dimensional view of a trench MOSFET device according to aspects of the present disclosure. FIG. 5B is a cross-sectional schematic diagram of portions of a trench MOSFET device of FIG. 5A including a cross sectional view in the x-y plane and a cross sectional view in the y-z plane along the A-A' line of FIG. 5A. The trench MOSFET device 500 of FIG. 5A or 5B has a surface contact to the heavily doped source region 550 in the x-y plane and the sidewall trench contact to the body region 530 in the y-z plane. The channel width direction is orthogonal to the depth direction of the gate trenches.

Specifically, a heavily doped contact implant 545 of the second conductivity type is formed at the bottom of a body contact trench 570b and its sidewall where it contacts with the lightly doped source region 540 of the first conductivity type in the y-z plane. By way of example, and not by way of limitation, the heavily doped contact implant may be formed by counter doping the lightly doped source region 540. The contact implant 545 may be doped with any suitable n-type dopant species, such as phosphorous or arsenic. By way of example, and not by way of limitation, the doping concentration of heavily doped contact implant 545 may range from about $5 \times 10^{18}/cm^3$ to about $1 \times 10^{19}/cm^3$, which is not enough to counter dope the heavily doped source region 550. In addition, a source contact opening 570a is formed above the heavily doped source region 550 through the dielectric layer 560 and filled with conductive material to form a surface contact from an overlying metal layer 580 to the heavily doped source region 550 in the x-y plane. That is, each of the heavily doped source region 550 and the lightly doped source region 540 spans the width of the region between the two adjacent gate trenches 520. Other than the source contact opening 570a, the body contact trench 570b and the contact implant 545 formed in the y-z plane, the MOSFET device of FIGS. 5A and 5B has a substrate 510 that includes an epitaxial layer of a first conductivity type on top of a heavily doped silicon wafer of the same conductivity type, a body region 530 of a second conductivity type formed above the substrate 510, a gate electrode 524 in a gate trench 520 formed in the body region 530, a lightly doped source region 540 of the first conductivity type formed in the top portions of the body region 530 and a heavily doped source region 540 of the first conductivity type formed above the lightly doped source region 540. Since the configuration of the MOSFET device 500 of FIGS. 5A and 5B is similar to the configuration of MOSFET device 400 of FIG. 4, the description of features common to both configurations is not repeated herein for simplicity.

Fabrication Process for Embodiment 1

Figure 6A:
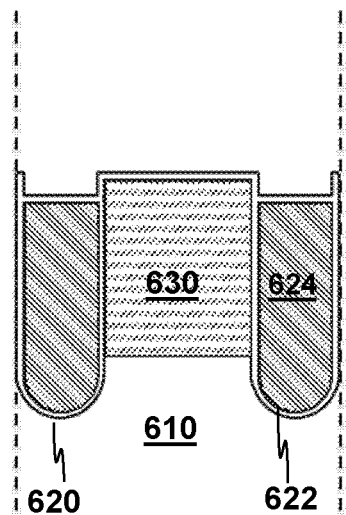
FIGS. 6A-6H are cross-sectional schematic diagrams illustrating a method for fabricating a trench MOSFET device of FIG. 4 according to aspects of the present disclosure.

FIGS. 6A-6H are cross-sectional views illustrating the fabrication process for forming a trench MOSFET 400 of FIG. 4 having a trench contact to the body region 430 as well as a sidewall contact to the heavily doped source region 450 in the x-y plane FIG. 6A is the cross sectional view of the device after performing body diffusion process. Specifically, the process uses a semiconductor substrate 610 of a first conductivity as a starting material. For a p-channel device, the substrate 610 may include an p-type epitaxial layer on top of a heavily doped p type (p+) silicon wafer. A mask (not shown) applied on the substrate 610 includes openings to define locations of a plurality of gate trenches for the trench transistors of the MOSFET device 400. An etching process is performed and the corresponding portions of the underlying substrate 610 are etched down to form a plurality of the gate trenches 620. Once the trenches 620 have been formed and the mask has been removed, a sacrificial oxide layer (not shown) may be grown and then removed to improve the silicon surface in the trenches. An insulating layer (e.g., gate oxide) 622 is then formed along the inner surface of the gate trenches 620. A conductive material is then deposited over the gate oxide layer 622. In some embodiments, the conductive material can be in-situ doped or undoped polysilicon. A gate electrode 624 for each trench transistor is thus formed as shown in FIG. 6A after an etch-back process on the conductive material over the substrate 610. A body implant is performed to form body regions 630. The dopant ions are of the opposite conductivity type to the doping of the substrate 610. For a p-channel device, the dopant ions can be Phosphorous or Arsenic ions. For an n-channel device, Boron ions can be used. Afterwards, a thermal diffusion is carried out to activate dopant atoms and to diffuse the dopants to form the body regions 630 as shown in FIG. 6A.

Figure 6B:
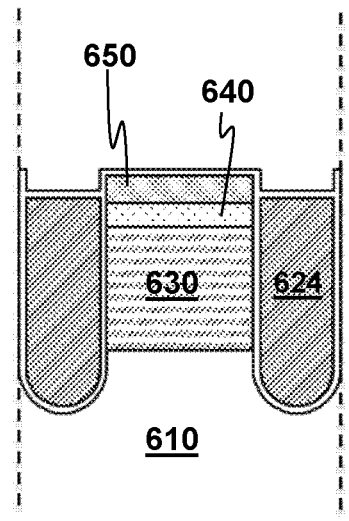
Figure 6C:
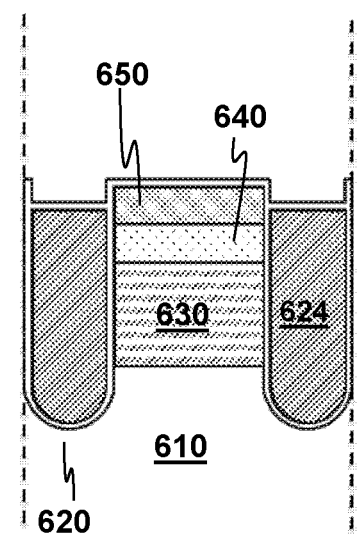

Referring to FIG. 6B, a source implant is performed using a source mask (not shown). Specifically, the source implant is a combination of deep boron (p−) implant and a shallow boron (p+) implant. Source region diffusion is then followed to form a lightly doped source region 640 in the body region 630 deeper than the heavily doped source region 650 as shown in FIG. 6C. By way of example and not by way of limitation, the doping concentration of the lightly doped source region 640 may range from about $5 \times 10^{15}/cm^3$ to about $1 \times 10^{18}/cm^3$ while the doping concentration of the heavily doped source region 650 may range from about $8 \times 10^{19}/cm^3$ to about $1 \times 10^{20}/cm^3$. By way of example and not by way of limitation, the lightly doped source region 640 may extend between the body region 630 and heavily doped source region 650. A depth D of the body region 630 may be between 0.5T and 0.8T, where T is the depth of the gate trenches 620. The depth of the lightly doped region 640 may be between 0.4D and 0.5D. The depth of the heavily doped source region 650 may be between 0.1D and 0.25D. The depth of the various regions may be controlled through control of the implantation energy, which is typically in a range from 10 keV to 500 keV.

Figure 6D:
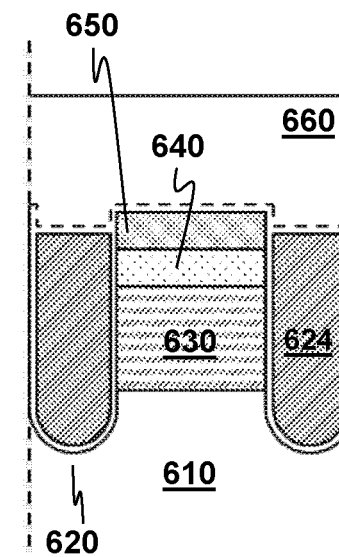

Subsequently, a planarized dielectric layer 660 is deposited over the substrate 610 as shown in FIG. 6D. In some embodiments, the dielectric layer 660 is formed by a low temperature oxide deposition followed by a deposition of Borophosphorosilicate Glass (BPSG).

Figure 6E:
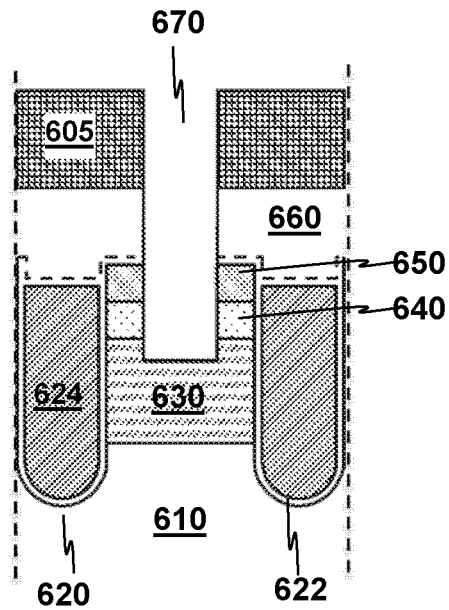

A photoresist 605 is then applied on the dielectric layer 660 with a pattern that has an opening at the locations of contact trenches. An etch process is performed to remove the uncovered portions of the dielectric layer 660 and form contact trenches 670 through the source regions (640 and 650) into the body region 630 as shown in FIG. 6E. By way of example and not by way of limitation, the width of the contact trench 670 ranges from 0.2 μm to 1.5 μm.

Figure 6F:
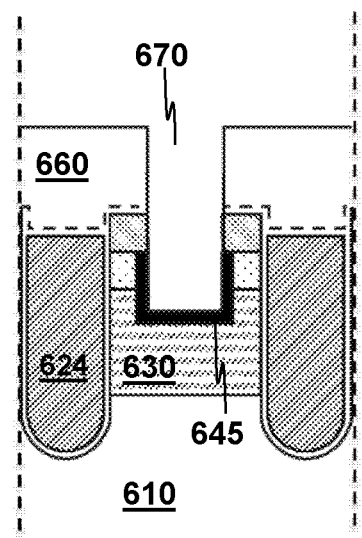

After the photoresist 605 is removed, an implant process is performed to form a contact implant 645 as shown in FIG. 6F. By way of example and not by way of limitation, the contact implant 645 may be formed by using a large tilt angle 4 rotational implant with an energy level about 40-80 KeV. For a p-channel device, the dopant ions can be Phosphorous or Arsenic ions. For an n-channel device, Boron ions can be used. By way of example and not by way of limitation, the doping concentration of the contact implant 645 may range from about $5 \times 10^{18}/cm^3$ to about $5 \times 10^{19}/cm^3$, which is not enough to counter dope the heavily doped source region 650. As such, a PN diode formed on the sidewall of contact trench 670 where it contacts with the lightly doped source region 640.

Figure 6G:
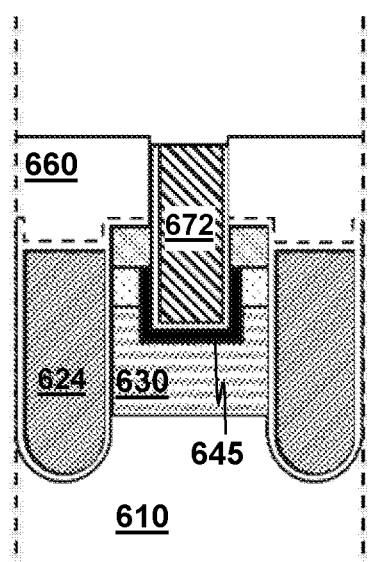

A barrier metal may be deposited over the surface of the contact trench 670. By way of example, and not by way of limitation, the barrier metal may be titanium (Ti), Ti/TiN that is deposited through physical vapor deposition (PVD), or it may be an alloy such as TiN which may be deposited by CVD or PVD. After the barrier metal has been deposited, a conductive material (tungsten) may be deposited by CVD or PVD in the contact trench 670 to form the source contact 672 as shown in FIG. 6G.

Figure 6H:
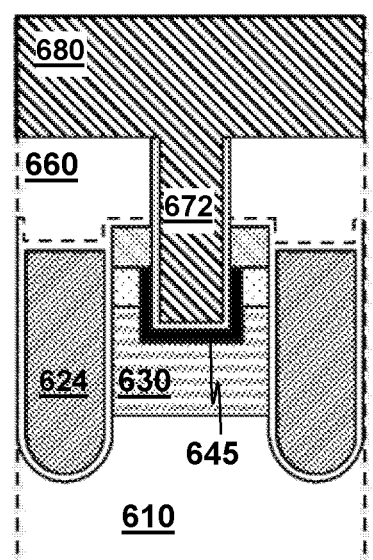

A metal layer 680 is then deposited above the dielectric layer 660 as shown in FIG. 6H. The metal layer 680 may be made from a conductive material such as aluminum. The metal layer 680 and the source contact 672 interconnect all the source regions to form the trench MOSFET device 400.

Fabrication Process for Embodiment 2

FIGS. 7A-7H are cross-sectional views illustrating the fabrication process forming a trench MOSFET device 500 of FIGS. 5A-5B having a surface contact to the heavily doped source region in the x-y plane and sidewall trench contact to the body region in the y-z plane.

Figure 7A:
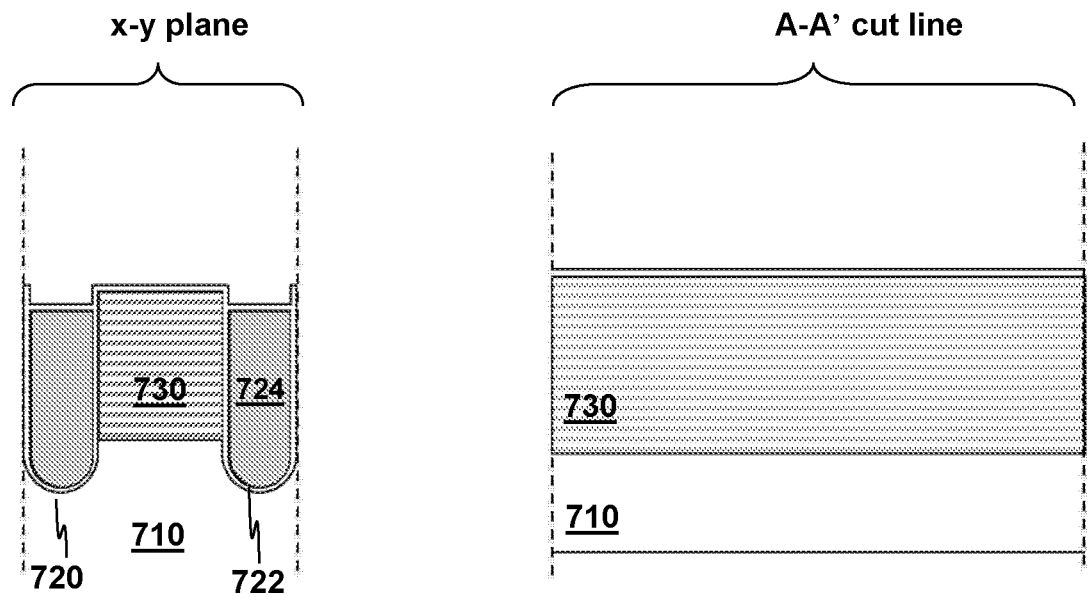
FIGS. 7A-7H are cross-sectional schematic diagrams illustrating a method for fabricating a trench MOSFET device of FIGS. 5A-5B according to aspects of the present disclosure.

FIG. 7A shows the cross sectional views of the device in the x-y plane and the cross sectional view of the device in the y-z plane along the A-A' cross section of FIG. 5 after performing body diffusion process. Specifically, the process uses a semiconductor substrate 710 of a first conductivity as a starting material. For a p-channel device, the substrate 710 may include a p-type epitaxial layer on top of a heavily doped p type (p+) silicon wafer. A mask (not shown) applied on the substrate 710 includes openings to define locations of a plurality of gate trenches for the trench transistors of the MOSFET device 700. An etching process is performed and the corresponding portions of the underlying substrate 710 are etched down to form a plurality of the gate trenches 720. Once the trenches 720 have been formed and the mask has been removed, a sacrificial oxide layer (not shown) may be grown and then removed to improve the silicon surface in the trench. An insulating layer (e.g., gate oxide) 722 is then formed along the inner surface of the gate trenches 720. A conductive material is then deposited over the gate oxide layer 722. In some embodiments, the conductive material can be in-situ doped or undoped polysilicon. A gate electrode 724 for each trench transistor is thus formed as shown in FIG. 7A after an etch-back process on the conductive material over the substrate 710. A body implant is performed to form body regions 730. The dopant ions are of the opposite conductivity type to the doping of the substrate 710. For a p-channel device, the dopant ions can be Phosphorous or Arsenic ions. For an n-channel device, Boron ions can be used. Afterwards, a thermal diffusion is carried out to activate dopant atoms and to diffuse the dopants to form the body regions 730 as shown in FIG. 7A.

Figure 7B:
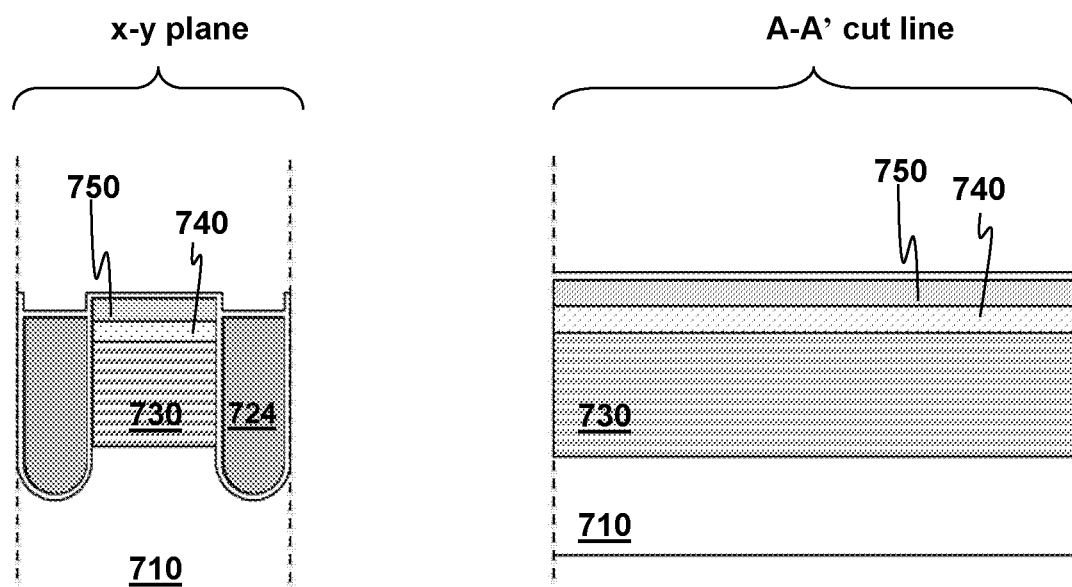
Figure 7C:
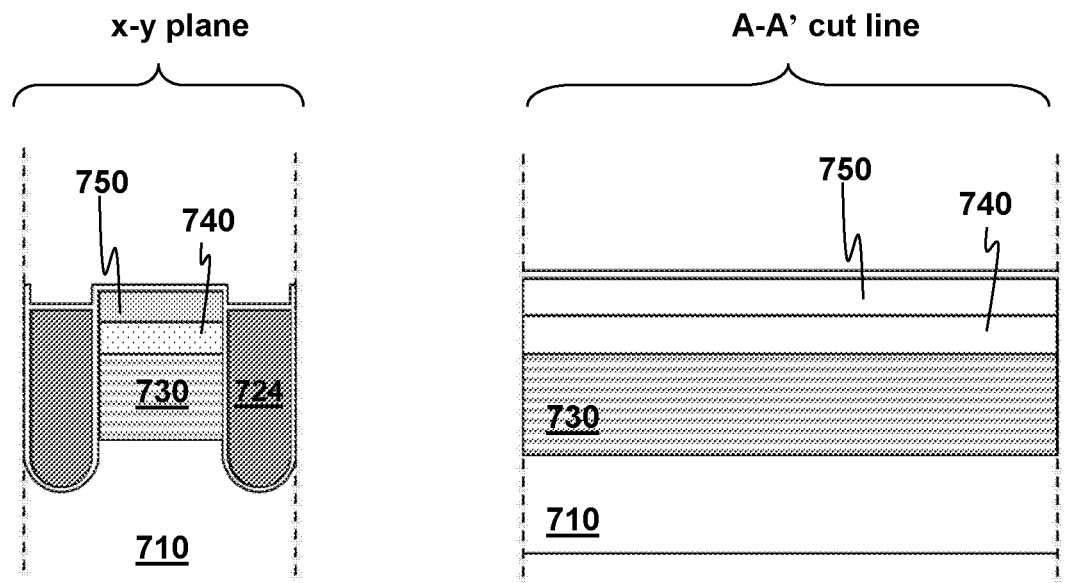

Referring to FIG. 7B, a source implant is performed using a source mask (not shown). Specifically, the source implant is a combination of deep boron (p−) implant and a shallow boron (p+) implant. Source region diffusion is then followed to form a lightly doped source region 740 in the body region 730 deeper than the heavily doped source region 750 as shown in FIG. 7C. By way of example and not by way of limitation, the doping concentration of the lightly doped source region 740 may range from about $5 \times 10^{15}/cm^3$ to about $1 \times 10^{18}/cm^3$ while the doping concentration of the heavily doped source region 750 may range from about $8 \times 10^{19}/cm^3$ to about $1 \times 10^{20}/cm^3$. By way of example and not by way of limitation, the lightly doped source region 740 may extend between the body region 730 and heavily doped source region 750. A depth D of the body region 730 may be between 0.5T and 0.8T, where T is the depth of the gate trenches 720. The depth of the lightly doped region 740 may be between 0.4D and 0.5D. The depth of the heavily doped source region 750 may be between 0.1D and 0.25D. The depth of the various regions may be controlled through control of the implantation energy, which is typically in a range from 10 keV to 500 keV.

Figure 7D:
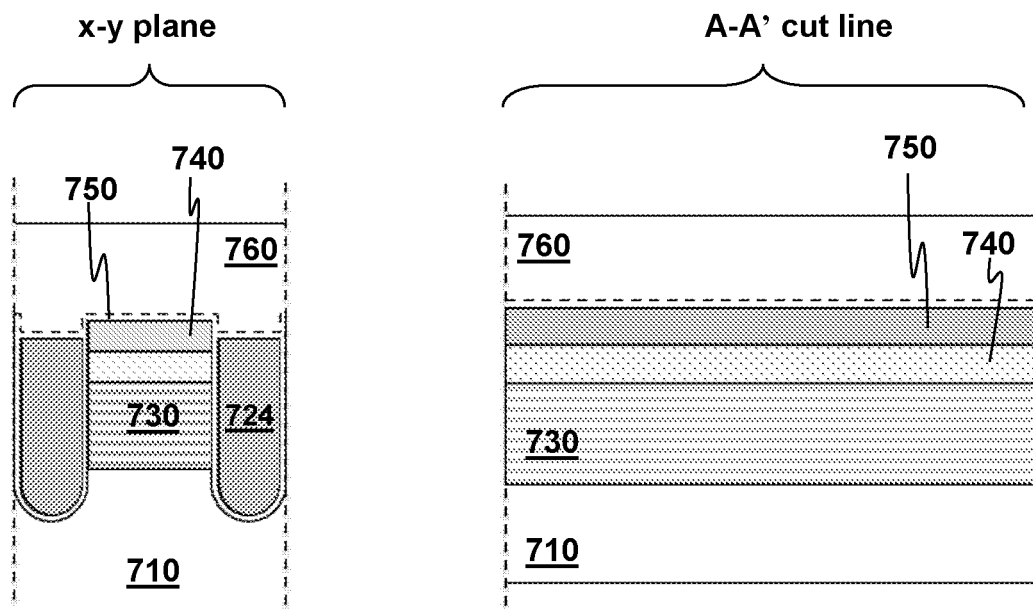

Subsequently, a planarized dielectric layer 760 is deposited over the substrate 710 as shown in FIG. 7D. In some embodiments, the dielectric layer 760 is formed by a low temperature oxide deposition followed by a deposition of Borophosphorosilicate Glass (BPSG).

Figure 7E:
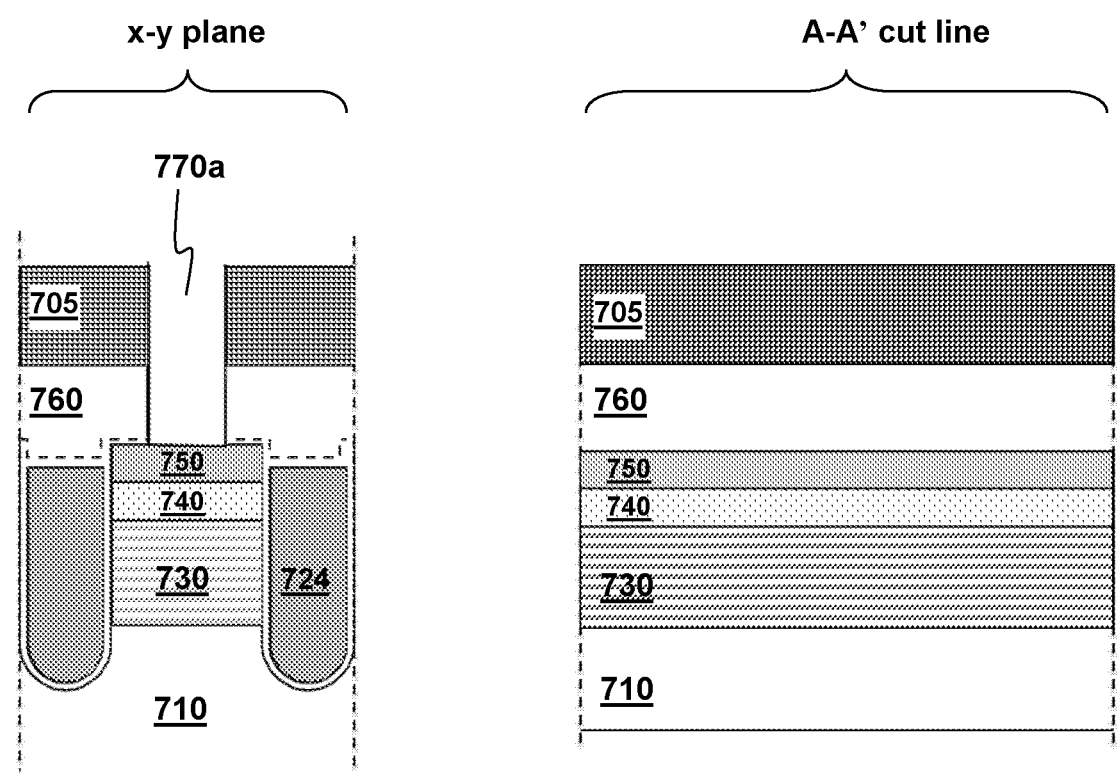
Figure 7E:
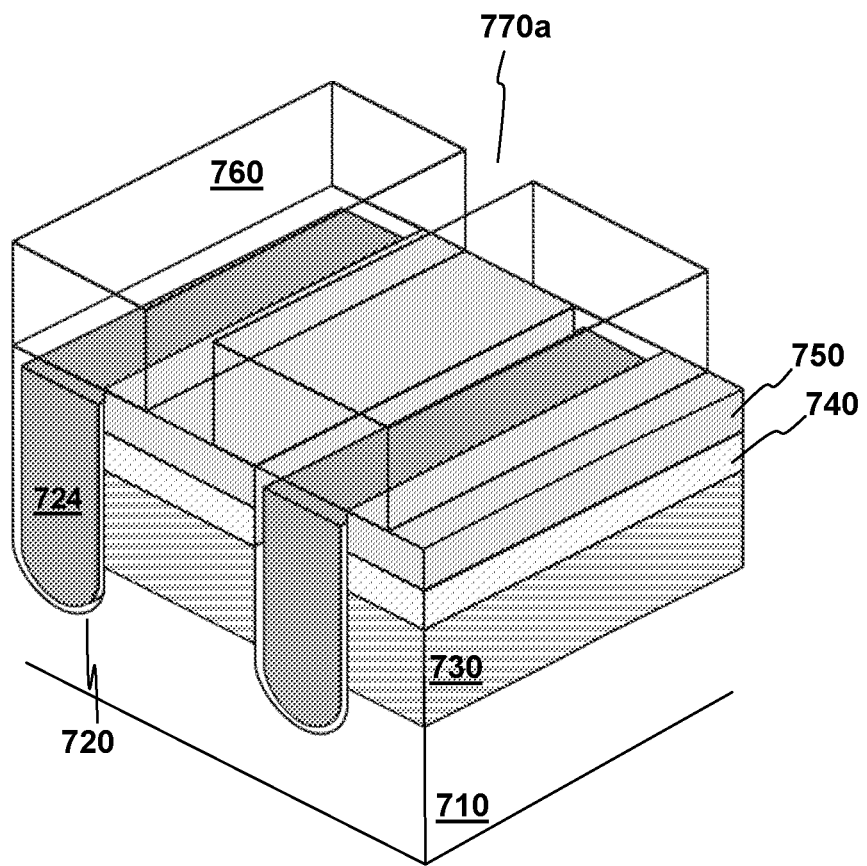

A photoresist 705 is then applied on the dielectric layer 760 with a pattern that has an opening at the locations of source contact trenches. An etch process is performed to remove the uncovered portions of the dielectric layer 760 and form source contact trenches 770a over the heavily doped source region 750 as shown in FIG. 7E. FIG. 7E' shows a three-dimensional view of FIG. 7E after the remaining photoresist 705 is removed. By way of example and not by way of limitation, the width of the source contact trench 770a ranges from 0.2 µm to 1.5 µm.

Figure 7F:
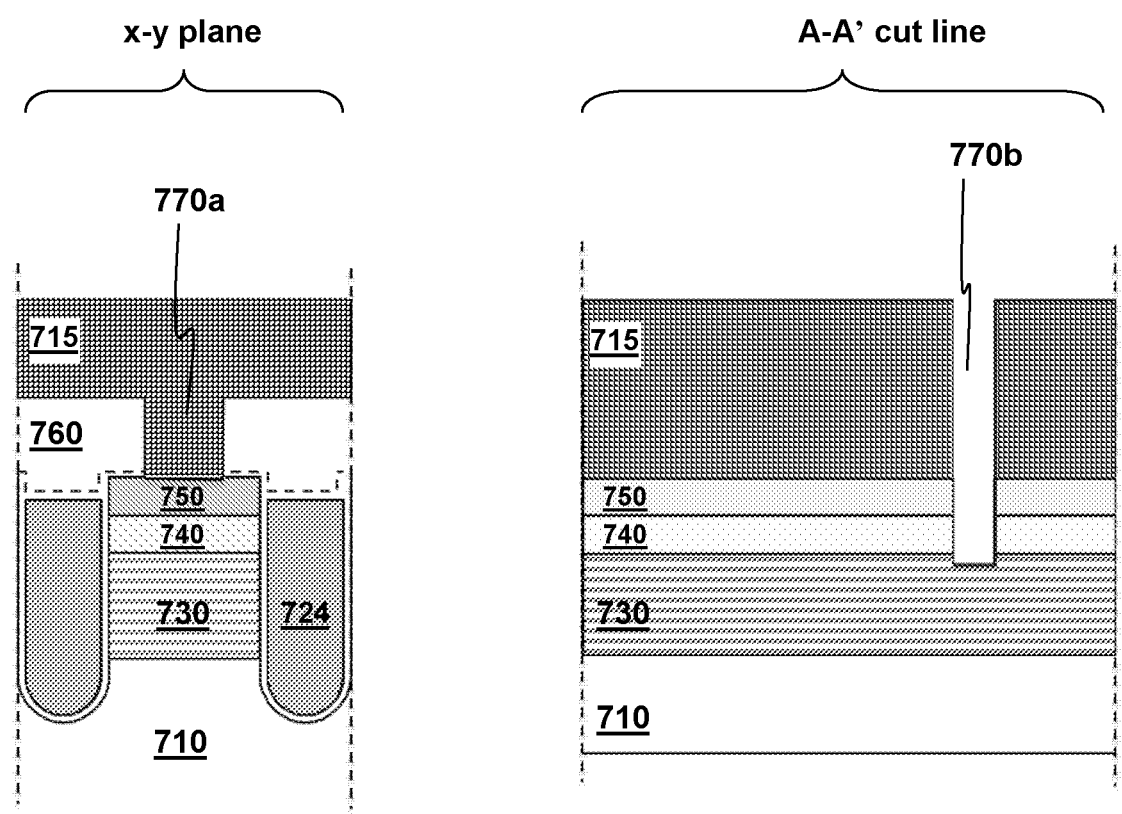
Figure 7F:
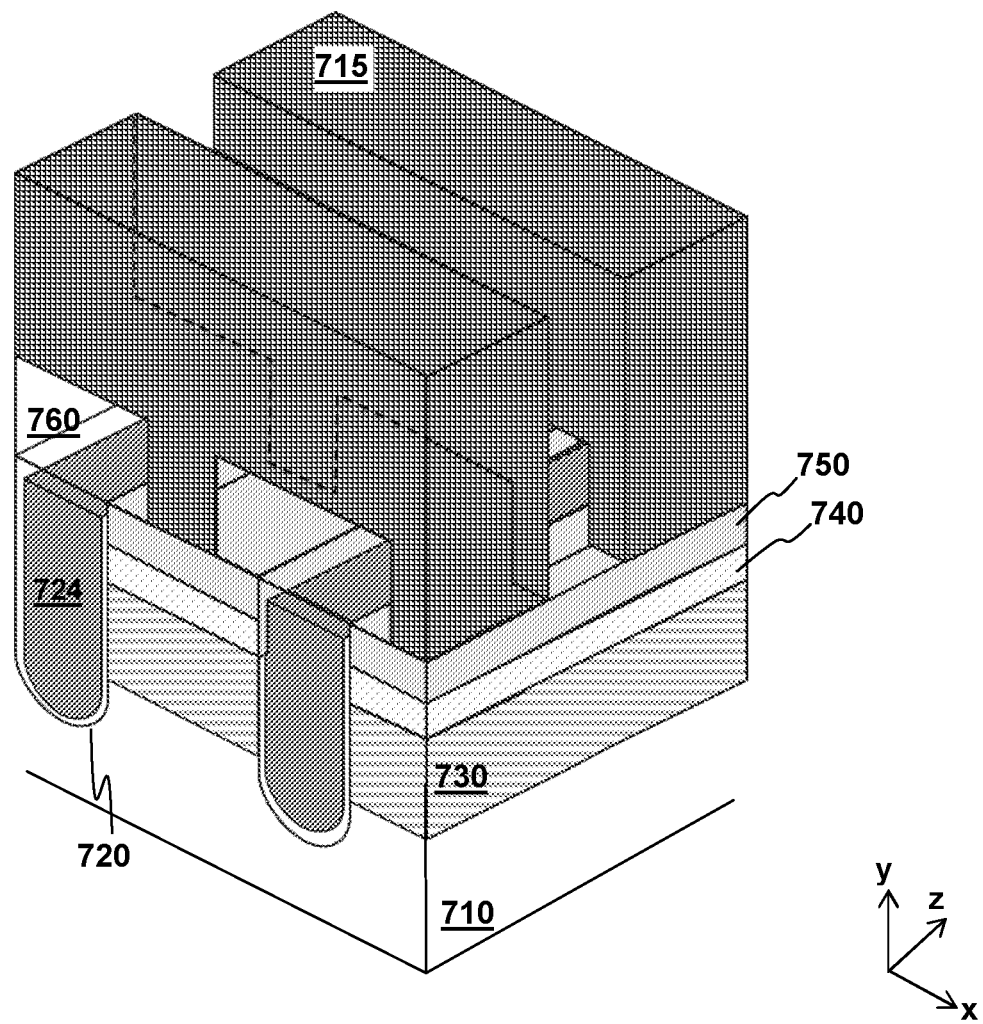

Another photoresist 715 is then applied on the dielectric layer 760 and the exposed heavily doped source region 750 with a pattern that has an opening at the locations of body contact trenches in the y-z plane. An etch process is performed to etch the exposed silicon and form body contact trenches 770b through the source regions (740 and 750) into the body region 730 as shown in FIG. 7F. FIG. 7F' shows a three-dimensional view of FIG. 7F before etching through the source regions (740 and 750) and into the body region 730. By way of example and not by way of limitation, the width of the body contact trench 770b ranges from 0.5 µm to 5.0 µm. As shown in FIGS. 7E, 7E', 7F and 7F', the source surface contact trench 770a is orthogonal to the body contact trench 770b.

Figure 7G:
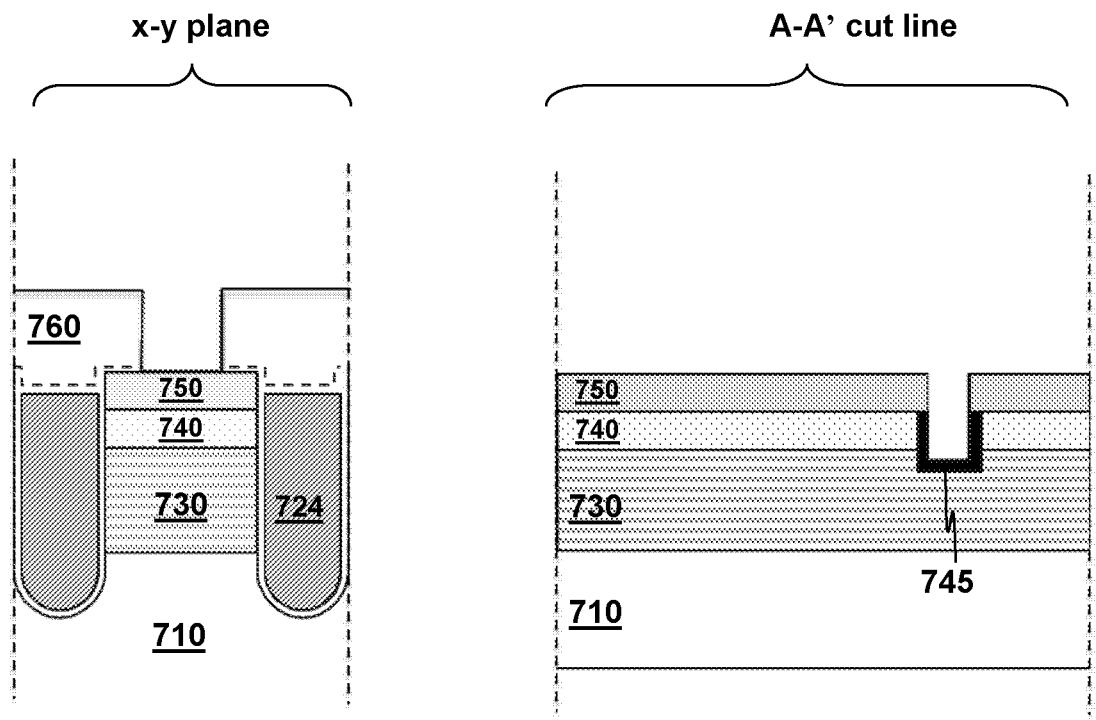

After the photoresist 715 is removed, an implant process is performed to form a contact implant 745 as shown in FIG. 7G. By way of example and not by way of limitation, the contact implant 745 may be formed by using a large tilt angle 4 rotational implant with an energy level about 40-80 KeV. In some embodiments, the dopant ions can be Phosphorous or Arsenic ions for an p-channel device. In some embodiments, Boron ions can be used for n-channel devices. By way of example and not by way of limitation, the doping concentration of the contact implant 745 may range from about $5 \times 10^{18}/cm^3$ to about $5 \times 10^{19}/cm^3$, which is not enough to counter dope the heavily doped source region 750. As such, a PN diode formed on the sidewall of body contact trench 770b where it contacts with the lightly doped source region 740 in the plane of the channel width direction.

Figure 7H:
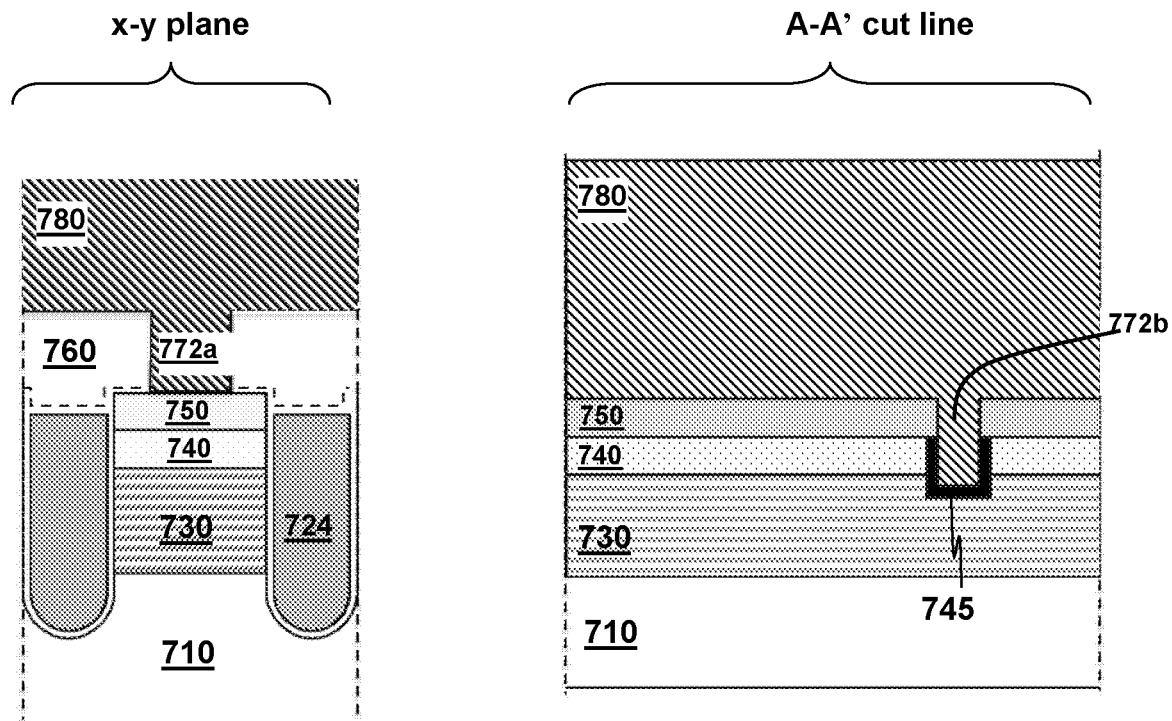

As shown in FIG. 7H, a source contact, a body contact and a metal layer are formed. Specifically, a source contact 772a is formed in each source contact trench 770a by filling the contact openings with a conductive material. A body contact 772b is formed in each body contact trench 770b by filling the contact opening with a conductive material. A metal layer 780 is then deposited above the dielectric layer 760. The metal layer 780 may be made from a conductive material such as aluminum. The metal layer 780, the source contact 772a and the body contact 772b interconnect all the source regions to form the trench MOSFET device 700.

While the above is a complete description of the preferred embodiments of the present invention, it is possible to use various alternatives, modifications, and equivalents. Therefore, the scope of the present invention should be determined not with reference to the above description but should, instead be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for." Any element in a claim that does not explicitly state "means for" performing a specified function, is not to be interpreted as a "means" or "step" clause as specified in 35 USC § 112, ¶6.

What is claimed is:

1. A trench metal-oxide-semiconductor field-effect transistor (MOSFET) device, comprising:
   a) a substrate of a first conductivity type, the substrate comprising a semiconductor epitaxial layer of the first conductivity type provided on top of a heavily doped semiconductor wafer of the same conductivity type;
   b) a body region of a second conductivity type that is opposite to the first conductivity type formed above the substrate;
   c) a gate trench formed in the body region and substrate, wherein the gate trench is lined with a dielectric layer and a gate electrode is formed in the gate trench;
   d) a lightly doped source region and a heavily doped source region formed in the body region, wherein the lightly doped source region extends deeper into the body region than the heavily doped source region; and
   e) a trench contact formed in a contact trench extending into the body region, wherein a contact implant of the second conductivity type is formed surrounding a bottom portion of the contact trench and sidewall portions of the contact trench where it contacts the lightly doped source region, wherein the contact implant at the sidewall portions of the contact trench separates the lightly doped source region from directly contacting a source metal.

2. The device of claim 1, wherein the first conductivity type is a p-type conductivity type and the second conductivity type is an n-type conductivity type.

3. The device of claim 1, wherein a ballast resistor is formed at the lightly doped source region between the heavily doped source region and the body region.

4. The device of claim 1, wherein a PN diode is formed at a contact between the contact implant and the lightly doped source region.

5. The device of claim 1, wherein the contact trench is provided between two adjacent gate trenches.

6. The device of claim 5, wherein the trench contact provides a sidewall trench contact to the body region as well as the heavily doped source region in a plane of a depth direction of the gate trench.

7. The device of claim 5, wherein the contact trench has a width ranging from 0.2 µm to 1.5 µm.

8. The device of claim 7, further comprising a surface contact formed in a surface contact above the heavily doped source region.

9. The device of claim 8, wherein the trench contact provides a sidewall trench contact and a surface contact to the body region in the plane of a channel width direction and the surface contact provides a source surface contact to the heavily doped source region in the plane of a depth direction of the gate trench.

10. The device of claim 8, wherein the contact trench has a width ranging from 0.5 µm to 5.0 µm and wherein the surface contact trench has a width ranging from 0.2 µm to 1.5 µm.

11. The device of claim 1, wherein the trench contact is shorter than the gate electrode.

12. The device of claim 1, wherein the contact trench runs perpendicular to a surface source contact trench.

13. The device of claim 1, wherein the contact trench extends to the body region in a plane of a channel width direction that is orthogonal to a plane of a depth direction of the gate trench.

14. A method for manufacturing a trench MOSFET device, comprising:
   a) forming a body region in a substrate, wherein the substrate comprises an epitaxial semiconductor layer of a first conductivity type on top of a heavily doped semiconductor wafer of the same conductivity type, wherein the body region is of a second conductivity type that is opposite to the first conductivity type;

b) forming a gate electrode in a gate trench, wherein the gate trench is formed in the body region and the substrate and lined with a dielectric layer;

c) forming a lightly doped source region and a heavily doped source region in the body region, wherein the lightly doped source region extends deeper into the body region than the heavily doped source region;

d) forming a trench contact in a contact trench extending to the body region and forming a contact implant of the second conductivity type surrounding a bottom portion of the contact trench and sidewall portions of the contact trench where it contacts the lightly doped source region, wherein the contact implant at the sidewall portions of the contact trench separates the lightly doped source region from directly contacting a source metal.

15. The method of claim 14, wherein the first conductivity type is a p-type conductivity type and the second conductivity type is an n-type conductivity type.

16. The method of claim 14, wherein a PN diode is formed at a contact between the contact implant and the lightly doped source region.

17. The method of claim 14, wherein the contact trench is formed extending to the body region between two adjacent gate trenches and wherein the trench contact provides a sidewall trench contact to the body region as well as the heavily doped source region.

18. The method of claim 14, wherein the contact trench extends to the body region in a plane of a channel width direction that is orthogonal to a plane of a depth direction of the gate trench.

19. A method for manufacturing a trench MOSFET device, comprising:
   a) forming a body region in a substrate, wherein the substrate comprises an epitaxial semiconductor layer of a first conductivity type on top of a heavily doped semiconductor wafer of the same conductivity type, wherein the body region is of a second conductivity type that is opposite to the first conductivity type;
   b) forming a gate electrode in a gate trench, wherein the gate trench is formed in the body region and the substrate and lined with a dielectric layer;
   c) forming a lightly doped source region and a heavily doped source region in the body region, wherein the lightly doped source region extends deeper into the body region than the heavily doped source region;
   d) forming a trench contact in a contact trench extending to the body region and forming a contact implant of the second conductivity type surrounding a bottom portion of the contact trench and sidewall portions of the contact trench where it contacts the lightly doped source region, wherein the lightly doped source region and the heavily doped source region is formed by a source implant comprising a combination of a deep source implant and a shallow source implant, wherein dopant ions for the deep source implant and the shallow source implant are of the same conductivity type to that of the substrate.

20. The method of claim 14, A method for manufacturing a trench MOSFET device, comprising:
   a) forming a body region in a substrate, wherein the substrate comprises an epitaxial semiconductor layer of a first conductivity type on top of a heavily doped semiconductor wafer of the same conductivity type, wherein the body region is of a second conductivity type that is opposite to the first conductivity type;
   b) forming a gate electrode in a gate trench, wherein the gate trench is formed in the body region and the substrate and lined with a dielectric layer;
   c) forming a lightly doped source region and a heavily doped source region in the body region, wherein the lightly doped source region extends deeper into the body region than the heavily doped source region;
   d) forming a trench contact in a contact trench extending to the body region and forming a contact implant of the second conductivity type surrounding a bottom portion of the contact trench and sidewall portions of the contact trench where it contacts the lightly doped source region, wherein the contact implant is formed by using a large tilt angle 4 rotational implant.

21. A method for manufacturing a trench MOSFET device, comprising:
   a) forming a body region in a substrate, wherein the substrate comprises an epitaxial semiconductor layer of a first conductivity type on top of a heavily doped semiconductor wafer of the same conductivity type, wherein the body region is of a second conductivity type that is opposite to the first conductivity type;
   b) forming a gate electrode in a gate trench, wherein the gate trench is formed in the body region and the substrate and lined with a dielectric layer;
   c) forming a lightly doped source region and a heavily doped source region in the body region, wherein the lightly doped source region extends deeper into the body region than the heavily doped source region;
   d) forming a trench contact in a contact trench extending to the body region and forming a contact implant of the second conductivity type surrounding a bottom portion of the contact trench and sidewall portions of the contact trench where it contacts the lightly doped source region; and
   e) forming a surface contact in a surface contact trench above the heavily doped source region using a first mask and wherein the surface contact provides a source surface contact to the heavily doped source region.

* * * * *